United States Patent [19]

Wilhelm

[11] Patent Number: 5,539,350
[45] Date of Patent: Jul. 23, 1996

[54] COMMON MODE LOGIC LINE DRIVER SWITCHING STAGE

[75] Inventor: Wilhelm Wilhelm, München, Germany

[73] Assignee: Siemens Aktiengesellschaft, Munich, Germany

[21] Appl. No.: 267,810

[22] Filed: Jun. 28, 1994

[30] Foreign Application Priority Data

Jun. 28, 1993 [DE] Germany ............................ 43 21 483.5

[51] Int. Cl.[6] ...................... H03K 19/003; H03K 19/013
[52] U.S. Cl. ...................... 327/375; 327/480; 327/482; 327/491; 327/540; 326/126
[58] Field of Search ........................... 327/375, 378, 327/482, 489, 491, 561, 563, 108, 513, 540, 480; 326/18, 126, 127

[56] References Cited

U.S. PATENT DOCUMENTS

| | | | |
|---|---|---|---|
| 4,713,561 | 12/1987 | Yamada | 307/456 |
| 4,745,304 | 5/1988 | Wilson | 326/126 |
| 4,906,869 | 3/1990 | Masuoka | 307/455 |
| 4,948,991 | 8/1990 | Schucker et al. | 307/455 |
| 5,072,136 | 12/1991 | Naghshineh | 307/455 |
| 5,122,683 | 6/1992 | Sugoh et al. | 307/455 |
| 5,214,318 | 5/1993 | Nakanishi et al. | 307/303 |
| 5,293,083 | 3/1994 | Askin et al. | 307/443 |
| 5,381,057 | 1/1995 | Kuroda et al. | 326/126 |

FOREIGN PATENT DOCUMENTS

| | | |
|---|---|---|
| 0410479 | 1/1991 | European Pat. Off. . |
| 0440192 | 8/1991 | European Pat. Off. . |
| 4100278 | 7/1991 | Germany . |

OTHER PUBLICATIONS

Patents Abstracts of Japan, E–1113, Sep. 18, 1991 vol. 15, No. 371 & JP3–147421 (NEC) Jun. 24, 1991.
Patents Abstracts of Japan, E–1193, Apr. 22, 1992, vol. 16, No. 166 & JP4–14313 (Fujitsu) Jan. 20, 1992.
Proceedings of the IEEE, vol. 78, No. 11, Nov. 1990 (Wilson) "Advances in Bipolar VLSI".

*Primary Examiner*—Timothy P. Callahan
*Assistant Examiner*—Eunja Shin
*Attorney, Agent, or Firm*—Herbert L. Lerner; Laurence A. Greenberg

[57] ABSTRACT

A line driver switching stage includes a terminal for a reference potential, a terminal for a supply potential, and an output terminal of the line driver switching stage. A differential amplifier has a first and a second amplifier branch. The first amplifier branch has a resistor with first and second terminals. The first terminal of the resistor is the terminal for the reference potential. An emitter follower transistor has an emitter and has a base-to-emitter path connected between the second terminal of the resistor and the output terminal. A saturation prevention element has a first terminal connected to the output terminal and a second terminal connected to the second amplifier branch. A bipolar transistor has a base-to-emitter path connected between the second terminal of the saturation prevention element and the terminal for the supply potential. The bipolar transistor has a collector connected to the emitter of the emitter follower transistor.

1 Claim, 3 Drawing Sheets

COMMON MODE LOGIC LINE DRIVER SWITCHING STAGE

BACKGROUND OF THE INVENTION

1. Field of the Invention

The invention relates to a switching stage having the following characteristics:

(a) a differential amplifier with a first and a second amplifier branch;

(b) the first amplifier branch has a resistor;

(c) a first terminal of the resistor is a terminal for a reference potential; and (d) a second terminal of the resistor is connected to an output terminal (8) of the line driver switching stage through the base-to-emitter path of an emitter follower transistor.

One such switching stage is shown in the literature, namely in a article by George R. Watson, entitled "Advances in Bipolar VLSI" in Proceedings of the IEEE, Vol 78, No 11, November, 1990. Typically, the output of the switching stage is connected to a line on a printed wiring board. The characteristic wave impedance on the line is 50 ohms, as a standard. The line is terminated at the end by a wave resistor.

In order to keep the line at a high level (H), which for a reference potential of 0 V is typically on the order of −0.9 V, a static current of 22 mA flows through the emitter follower transistor, the line and the terminating resistor. Taking a finite current amplification of the emitter follower transistor into account, that current dictates a maximum resistance (200 ohms) for the load resistor in the differential amplifier branch. At a low level (L), which is typically on the order of −1.7 V, the switching current of the differential amplifier flows through the load resistor, so that a level rise of 0.8 V drops there. Thus if the maximum resistance of the load resistor is taken into account, a minimum value of 4 mA for the switching current is defined. The switching current and the current flowing through the emitter follower result in a relatively high power loss.

SUMMARY OF THE INVENTION

It is accordingly an object of the invention to provide a common mode logic line driver switching stage, which overcomes the hereinafore-mentioned disadvantages of the hereto-fore-known devices of this general type and which has a low power loss. With the foregoing and other objects in view there is provided, in accordance with the invention, a line driver switching stage, comprising a terminal for a reference potential, a terminal for a supply potential, and an output terminal of the line driver switching stage; a differential amplifier having a first and a second amplifier branch; the first amplifier branch having a resistor with first and second terminals; the first terminal of the resistor being the terminal for the reference potential; an emitter follower transistor having an emitter and having a base-to-emitter path connected between the second terminal of the resistor and the output terminal; a saturation prevention element having a first terminal connected to the output terminal and a second terminal connected to the second amplifier branch; and a bipolar transistor having a base-to-emitter path connected between the second terminal of the saturation prevention element and the terminal for the supply potential, the bipolar transistor having a collector connected to the emitter of the emitter follower transistor.

In accordance with another feature of the invention, the saturation prevention element is a resistor.

In accordance with a further feature of the invention, there is provided a connection node formed by the emitter of the emitter follower transistor and the collector of the bipolar transistor, a resistor connected between the connection node and the output terminal, and a series circuit of a diode and a resistor being connected between the first terminal of the saturation prevention element and the terminal for the reference potential.

In accordance with an added feature of the invention, there is provided a terminal for a further supply potential, and compensation current sources each having a positive temperature coefficient and each being connected between the terminal for the further supply potential and the base of a respective one of the emitter follower transistor and the bipolar transistor.

In accordance with an additional feature of the invention, there is provided a terminal for a further reference potential having a negative temperature coefficient corresponding in amount to a temperature coefficient of a base-to-emitter path of a bipolar transistor; and a voltage divider being connected between the terminal for the further reference potential and the terminal for the further supply potential and having a center terminal; each of the compensation current sources having a resistor and a bipolar transistor with an emitter connected to the resistor and a base connected to the center terminal.

In accordance with yet another feature of the invention, the saturation prevention element has a diode characteristic.

In accordance with a concomitant feature of the invention, in a differential embodiment, there is provided a further output terminal; the second amplifier branch including a further resistor having first and second terminals; the first terminal of the further resistor being connected to the terminal for the reference potential; a further emitter follower transistor having a base-to-emitter path connected between the second terminal of the further resistor and the further output terminal; a further bipolar transistor having a base connected to the first amplifier branch and having a collector-to-emitter path connected between the further output terminal and the terminal for the supply potential; a double emitter transistor having a collector connected to the second terminal of the further resistor, a first emitter connected to the base of the bipolar transistor, a second emitter connected to the collector of the bipolar transistor, and a base connected to the further output terminal; a further double emitter transistor having a collector connected to the second terminal of the resistor, a first emitter connected to the base of the further bipolar transistor, a second emitter connected to the collector of the further bipolar transistor, and a base connected to the output terminal.

Other features which are considered as characteristic for the invention are set forth in the appended claims.

Although the invention is illustrated and described herein as embodied in a common mode logic line driver switching stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
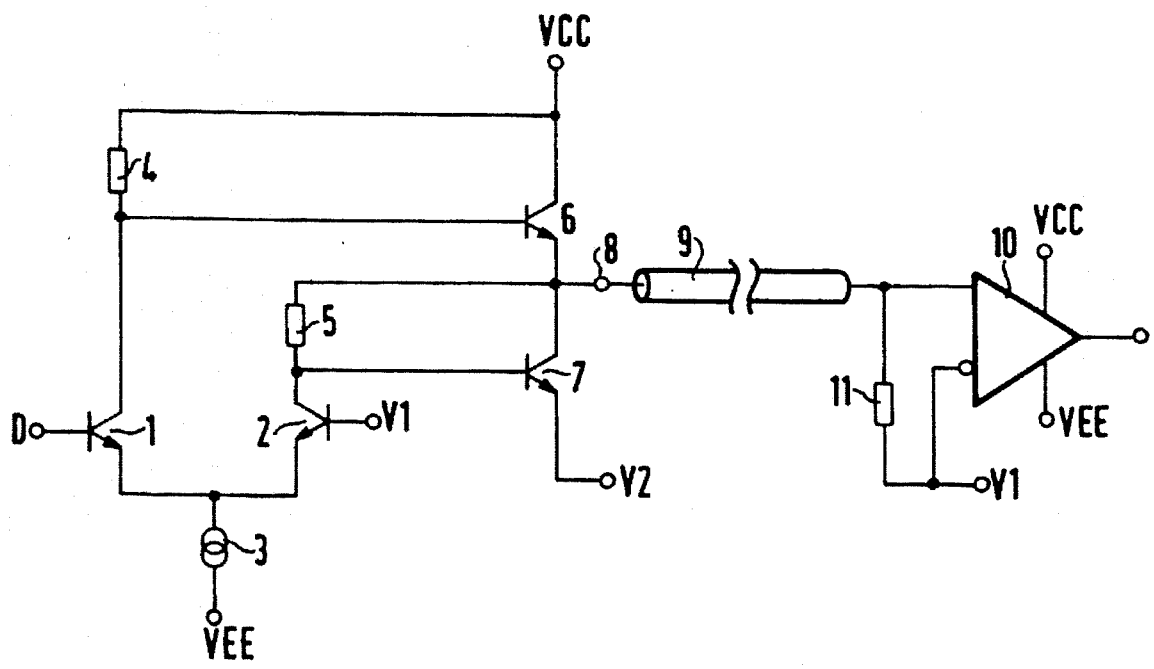
FIG. 1 is a schematic circuit diagram of a line driver switching stage according to the invention.

Referring now to the figures of the drawing in detail and first, particularly, to FIG. 1 thereof, there is seen a line driver switching stage which includes a differential amplifier with first and second differential amplifier branches that are supplied from a current source 3. Each amplifier branch includes a respective transistor 1 and 2. The transistor 1 is controlled by a data signal D. A base of the transistor 2 is connected to a reference potential V1 that is located in the middle of an input signal level rise. Typically, the reference potential V1 has a value of approximately −1.33 V. Collectors of the transistors 1, 2 are each connected to a base terminal of a respective one of two bipolar transistors 6, 7 that are connected in series by collector-to-emitter paths thereof. A junction of the transistors 6, 7 is an output terminal 8. A collector of the emitter follower transistor 6 is connected to a reference potential VCC (ground), and an emitter of the transistor 7 is connected to a supply potential V2. A voltage between the potentials V2 and VCC is, for instance, twice the voltage between the potentials V1 and VCC, or in other words −2.66 V. The first amplifier branch includes a load resistor 4, which has a first terminal connected to the reference potential VCC and a second terminal connected to the base of the transistor 6. A further resistor 5, which serves as a saturation prevention element for the transistor 7, has a first terminal connected to collector and a second terminal connected to the base of the transistor 7. The resistance of each of the resistors 4, is preferably the same.

By way of example, the output terminal 8 is connected to an output pad of an integrated circuit. The output pad is connected to an input stage 10 of a further integrated circuit through a line 9 which is disposed, for instance, on a printed wiring board. At the end of the line, the line 9 is terminated with a wave resistor 10 thereof. In the case of typical printed wiring boards, a characteristic wave impedance of the line 9 and an impedance of the terminating resistor 11 are each approximately 50 ohms. The terminating resistor 11 is connected to the reference potential V1. The reference potential V1 also supplies a reference transistor of the differential amplifier of the input stage 10.

The circuit functions as follows: if the input signal D is at an H level, then the transistor 1 is conducting and the transistor 2 blocks. The switching current of the current source 3 then flows through the resistor 4, which is dimensioned in such a way that a voltage which is equal to a signal level rise of 0.8 V drops at it. The transistor 6 functions as an emitter follower transistor, so that the output terminal 8 is at approximately −1.7 V. A static current then flows from the potential V1 through the terminating resistor 11, the line 9 and the transistor 7 to the potential V2. In the process, the current adjusts to 7.5 mA. If the input signal D is an L level, then the transistor 1 is blocked and the transistor 2 is conducting. The switching current of the current source 3 then flows through the emitter follower transistor 6, the resistor 5 and the transistor 2. The voltage drop at the resistor 5 assures that the transistor 7 is blocked, and thus a static current flows from the reference potential VCC to the potential V1, through the emitter follower transistor 6, the line 9 and the terminating resistor 11. The current is approximately 7.5 mA. The H level at the output 8 adjusts to −0.9 V.

The current respectively flowing through the transistors 6 and 7 when the level at the output 8 is H and L, is approximately 7.5 mA in both switching states. That is, it is only one-third of the maximum current in the known switching stage discussed at the outset. Consequently, the base currents of the transistors 6, 7 are only about one-third of the previously required value. The resistances of the resistors 4, 5 can thus be increased, and at the same time the switching current of the current source 3 can be reduced to one-third. The overall result is a power loss which is considerably reduced by approximately two-thirds.

Figure 2:
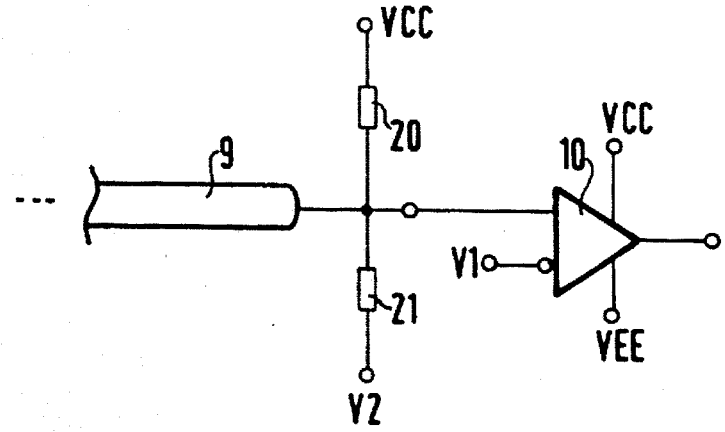
FIG. 2 is a circuit diagram of an embodiment of a line adaptation.

As an alternative to the adaptive termination of the line 9 shown in FIG. 1, an adaptation in accordance with the embodiment of FIG. 2 may also be employed. The line 9 is terminated toward each of the reference potential VCC and the supply potential V2 with a respective resistor 20 and 21. The resistors 20, 21 have twice the resistance of the resistor 11 of FIG. 1. The adaptation circuits shown in FIGS. 1 and 2 are both electrically equivalent. The advantage of the circuit of FIG. 2 is that the supply of the supply potential V2 to the line and the supply of the reference potential V1 to the input stage are separate from one another. As a result, load fluctuations in the supply circuit for the potential V2 do not affect the supply circuit for the potential V1. Since only the base currents of the reference transistors can be driven by the supply potential V1, this potential can advantageously be generated by simple voltage division from the supply potentials VCC, VEE, advantageously by using high-impedance resistors.

Figure 3:
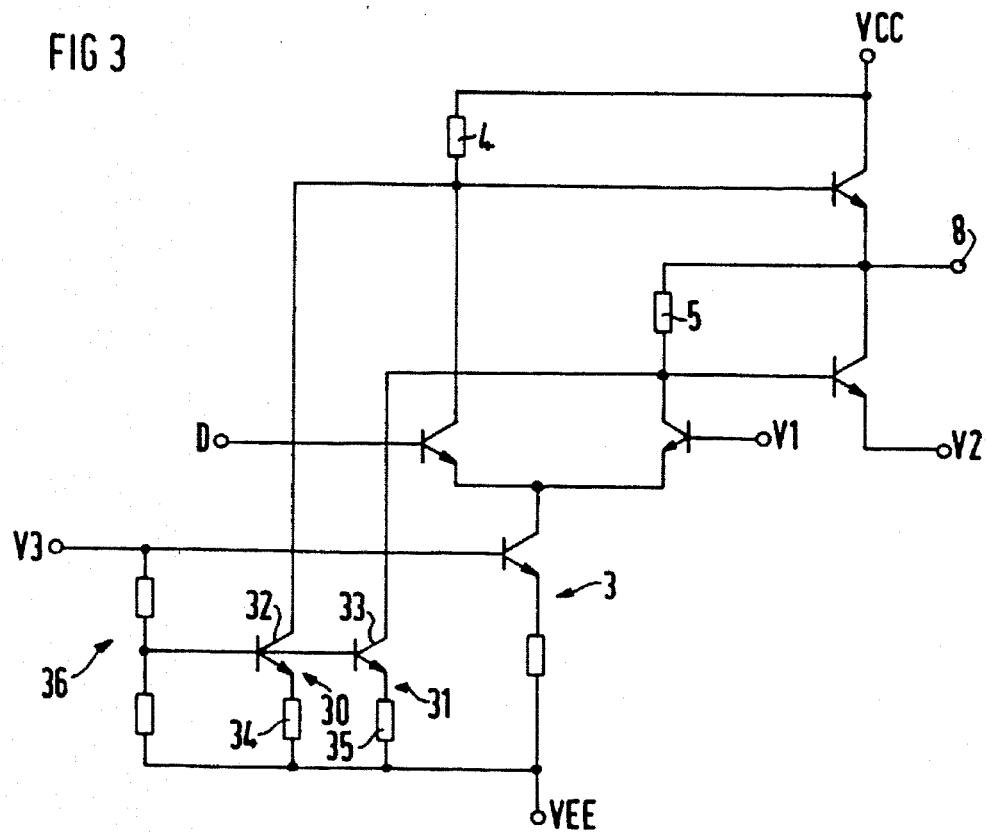
FIG. 3 is a circuit diagram of an embodiment for temperature-compensated output levels.

The line driver switching stage shown in FIG. 1 generates output levels with a positive temperature coefficient. This means that the signal levels rise as the temperature increases. This is because the voltage drop at a p-n junction, or in other words the base-to-emitter path of a bipolar transistor, decreases as the temperature increases. The temperature-dependent signal levels in these switching stages are in accordance with the so-called 10K industry standard. In order to attain temperature-compensated output levels (100K standard), compensation currents are fed to the resistors 4, 5 as is shown in FIG. 3. These currents are each generated by one compensation current source 30, 31, which are respectively connected between one of the resistors 4, 5 and the supply potential VEE. In the process, the compensation current sources 30, 31 each generate a temperature-dependent current with a positive temperature coefficient, which flows through the respective resistors 4 and 5 in addition to the current of the current source 3. The compensation currents generate a voltage drop at the resistors 4 and 5 with which the temperature response of the output signal levels at the output 8 is compensated for.

In a preferred embodiment, the compensation current sources 30, 31 are each made of a respective bipolar transistor 32 and 33 and an emitter-side resistor 34 and 35. Base terminals of the transistors 32, 33 are connected jointly to a center output of an ohmic voltage divider 36. The voltage divider is connected between a terminal for a further reference potential V3 and the supply potential VEE. The reference potential V3 has a negative temperature coefficient, which corresponds in amount to the temperature coefficient of a p-n junction. The switching current source 3, which is made of a bipolar transistor and an emitter-side resistor, is also triggered by the reference potential V3. As a result, the current impressed by the current source 3 is temperature-compensated.

The voltage applied to the center tap of the voltage divider 36 with respect to the supply potential VEE then has a negative temperature coefficient that is reduced in accordance with the division ratio of the voltage divider. In connection with the temperature response of the base-to-emitter voltage of the transistors 32, 33, the result is a current which is impressed by these current sources 30, 31 that has a positive temperature coefficient. At a voltage division ratio of 1:2 of the voltage divider 36, the result is compensation currents with which the temperature response of the output levels at the output 8 is compensated for.

Figure 4:
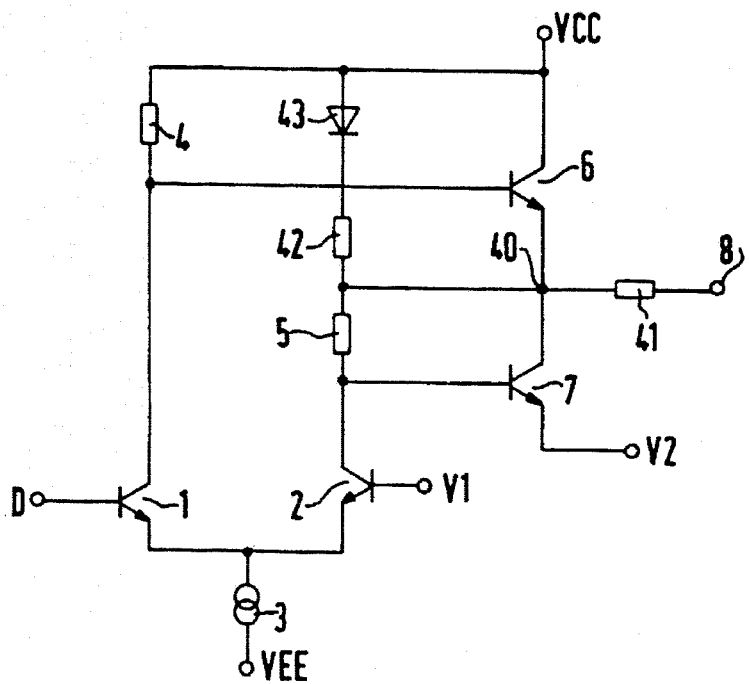
FIG. 4 is a circuit diagram of an embodiment for lines adapted on an input side.

Instead of the line adaptation at the line end as is shown in FIGS. 1 and 2, an adaptation can also be carried out at the beginning of the line as is shown in FIG. 4. For that purpose, a resistor 41 is connected between the output terminal 8 and a junction or node 40 of the emitter of the emitter follower transistor 6 and the collector of the transistor 7. The resistor 41 is dimensioned in such a way that the result, together with the output resistance of the switching stage which is operative at the node 40, is approximately the characteristic wave resistance of the line connected to the output 8.

Additionally connected between the node 40 and the supply potential VCC is a series circuit including a path of a diode 43 and a resistor 42. Advantageously, each of the resistors 4, 5, 42 has the same resistance. At an H level for the input signal D, the current of the current source 3 flows across the resistor 4. A conducting current path which is also connected between the potentials VCC and V2 includes the diode 43, the resistor 42, the node 40 and the bipolar transistor 7. Due to the symmetrical layout of the switching stage, in this case the voltage at the resistors 4 and 42 is of equal magnitude. Thus the last-mentioned current path between the potentials VCC and V2 is equal in magnitude to the current of the current source 3. In the state of repose, no static current then flows across the resistor 41 and along the line connected to the output 8. If the input signal D is an L level, then the current of the current source 3 flows through the current path formed by the emitter follower transistor 6, the node 40, the resistor 5, and the switching transistor 2. This blocks the transistor 7. In this case as well, no current flows through the resistor 41 in the state of repose. Accordingly, the line driver switching stage of FIG. 4 has the advantage of an extremely low static power loss, which is about one-fifth the power loss in the known line driver.

In FIGS. 1–4, the saturation prevention element between the collector and the base of the bipolar transistor 7 is constructed as an ohmic resistor 5. Instead of an ohmic resistor, some other component may be used at which a voltage of suitable magnitude drops if a current is flowing. A further embodiment of the voltage reducing element may be a component with a diode characteristic, or in other words the base-to-emitter path of a bipolar transistor or a p-n diode. This is illustrated in FIG. 5 in the differential embodiment of a line driver stage according to the invention.

As compared to the data input signal D, an inverted output signal is generated at the output 8, and the same-phase output signal is generated a further output 50. The components corresponding to the elements of FIGS. 1–4 are identified by the same reference numerals. The two differential amplifier branches are symmetrical in layout. The outputs 8, 50 are triggered from the junction of the bipolar transistors 6, 7 and bipolar transistors 51, 52, respectively, which are connected in series at their collector-to-emitter paths. The base of the transistor 6 is connected to the load resistor 4 and the base of the further emitter follower transistor 51 is connected to a load resistor 53. The resistors 4, 53 are each disposed in a respective differential amplifier branch. The base terminals of the bipolar transistor 7 and the further bipolar transistor 52 are each connected crosswise to the collector of one of the respective switch transistors 2, 1 of the other respective differential amplifier branch, in that order. A bipolar transistor 54, 55, each of which has two emitters, is provided as a saturation prevention element. The double emitter transistor 55 functions as a saturation prevention element for the transistor 7, while the further double emitter transistor 54 functions as a saturation prevention element for the transistor 52. The double emitter transistor 55 has a first emitter connected to the collector of the switching transistor 2, a base connected to a junction of the emitter of the transistor 51 and the collector of the transistor 52, and a collector connected to the resistor 54. A second emitter of the double emitter transistor 55 is connected to the collector of the bipolar transistor 7. Consequently, in the configuration described, the double emitter transistor 55 functions between the collector and the base of the transistor 7 like a diode. The double emitter transistor 54 is correspondingly also connected to the other differential amplifier branch. It likewise functions as a clamp diode between a collector and a base of the transistor 52 and has a first emitter connected to the collector of the switching transistor 1 and a second emitter connected to the collector of the bipolar transistor 52. The differential outputs 8, 50 are each connected to a line, with a 50 ohm characteristic wave impedance, for instance. The line is provided with an adaptation circuit at its end. The adaptation circuit may include two ohmic resistors having the characteristic wave impedance of the line and being connected to the potential V1 located in the middle of the signal level rise, or it may include a single resistor having twice the characteristic wave impedance and being connected between the two line ends.

Figure 5:
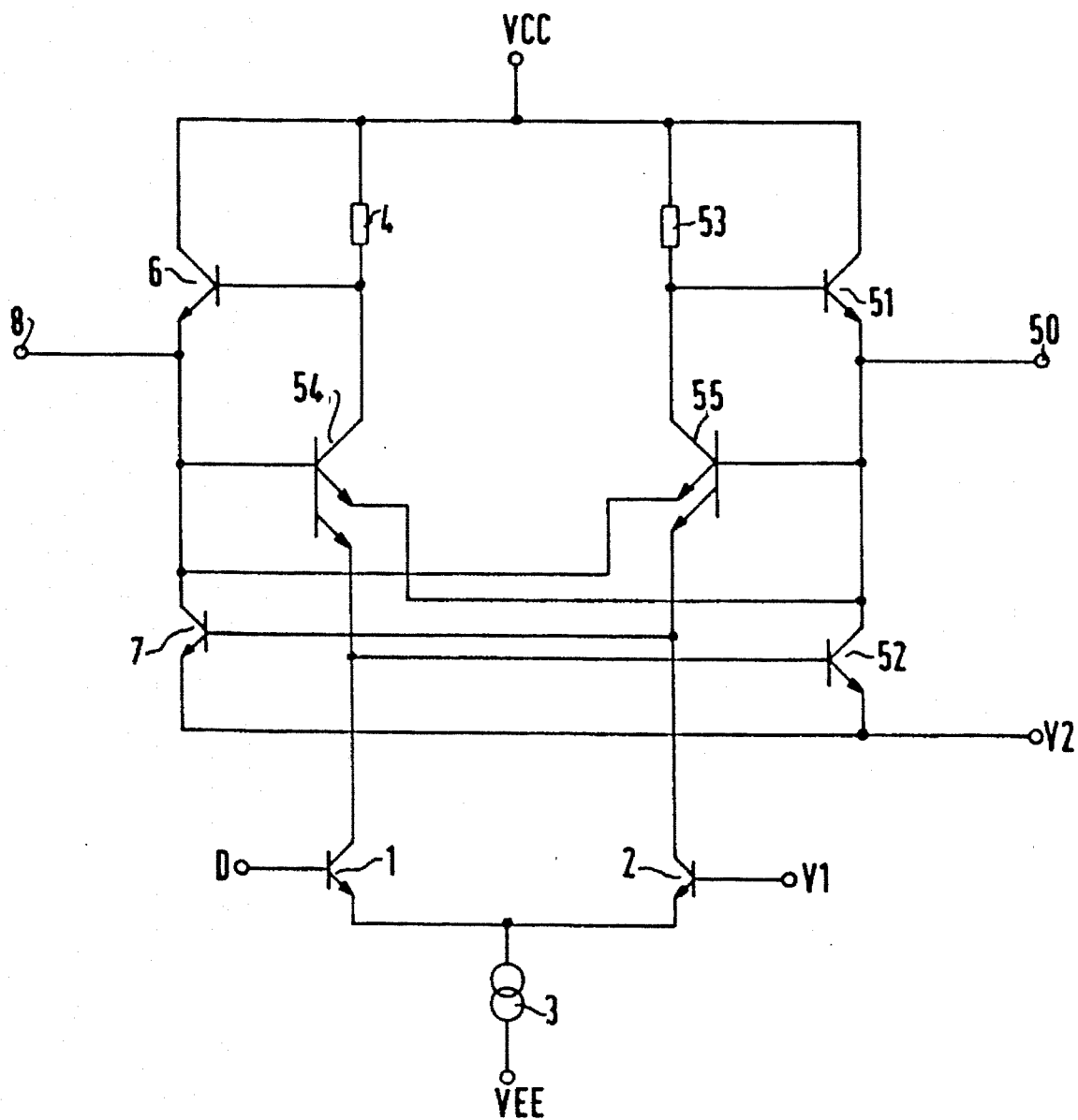
FIG. 5 is a circuit diagram of a differential embodiment.

As compared with a conventional differential layout, which uses two identical switching stages of FIG. 1 that are controlled by differential input signals by way of example, the differential line driver circuit of FIG. 5 includes only a single switching stage, which is supplied by a single switching current.

I claim:

1. A differential line driver switching stage, comprising:
   (a) a terminal for a reference potential, a terminal for a supply potential, an input terminal, and an output terminal of the line driver switching stage;
   (b) a differential amplifier having a transistor with a base terminal connected to said input terminal, said differential amplifier having a first and a second amplifier branch;
   (c) said first amplifier branch having a resistor with first and second terminals;
   (d) the first terminal of said resistor being said terminal for the reference potential;
   (e) an emitter follower transistor having an emitter and having a base-to-emitter path connected between the second terminal of said resistor and said output terminal;
   (f) a saturation prevention element having a diode characteristic and having a first terminal and a second terminal;
   (g) a bipolar transistor having a base-to-emitter path connected between the second terminal of said saturation prevention element and said terminal for the supply potential, said bipolar transistor having a collector connected to the emitter of said emitter follower transistor;

(h) a further output terminal;

(i) said second amplifier branch including a further resistor having first and second terminals;

(j) the first terminal of said further resistor being connected to said terminal for the reference potential;

(k) a further emitter follower transistor having a base-to-emitter path connected between the second terminal of said further resistor and said further output terminal;

(l) a further bipolar transistor having a base connected to said first amplifier branch and having a collector-to-emitter path connected between said further output terminal and said terminal for the supply potential;

(m) wherein said saturation prevention element is a double emitter transistor having a collector connected to the second terminal of said further resistor, a first emitter connected to the base of said bipolar transistor, a second emitter connected to the collector of said bipolar transistor, and a base connected to said further output terminal; and (n) a further double emitter transistor having a collector connected to the second terminal of said resistor, a first emitter connected to the base of said further bipolar transistor, a second emitter connected to the collector of said further bipolar transistor, and a base connected to said output terminal.

* * * * *